United States Patent
Kochar et al.

(10) Patent No.: US 9,218,893 B2
(45) Date of Patent: Dec. 22, 2015

(54) MEMORY TESTING IN A DATA PROCESSING SYSTEM

(71) Applicant: LENOVO ENTERPRISE SOLUTIONS (SINGAPORE) PTE. LTD., Singapore (SG)

(72) Inventors: Sumeet Kochar, Research Triangle Park, NC (US); Hai Qiang Li, Shanghai (CN); Xiang N. Li, Shanghai (CN); Chao C. Xu, Shanghai (CN)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 82 days.

(21) Appl. No.: 14/023,973

(22) Filed: Sep. 11, 2013

(65) Prior Publication Data

US 2014/0095948 A1    Apr. 3, 2014

(30) Foreign Application Priority Data

Sep. 28, 2012  (CN) .......................... 2012 1 0367361

(51) Int. Cl.
*G11C 29/10* (2006.01)
*G11C 29/56* (2006.01)
*G11C 29/04* (2006.01)

(52) U.S. Cl.
CPC ................ *G11C 29/10* (2013.01); *G11C 29/56* (2013.01); *G11C 2029/0401* (2013.01)

(58) Field of Classification Search
CPC .......... G11C 29/10; G11C 2029/0407; G11C 29/56; G11C 2029/0401; G11C 2029/4402; G11C 29/44

USPC .......................................................... 714/718
See application file for complete search history.

(56) References Cited

U.S. PATENT DOCUMENTS

| | | | |
|---|---|---|---|
| 6,230,290 B1 * | 5/2001 | Heidel et al. | 714/718 |
| 6,434,696 B1 | 8/2002 | Kang | |
| 6,766,474 B2 | 7/2004 | Schelling | |
| 6,965,989 B1 | 11/2005 | Strange et al. | |
| 7,162,625 B2 | 1/2007 | Stern et al. | |
| 7,325,176 B2 | 1/2008 | Larson et al. | |
| 7,610,523 B1 * | 10/2009 | Singh | 714/718 |
| 2004/0181716 A1 | 9/2004 | Stern et al. | |
| 2005/0071580 A1 * | 3/2005 | LeClerg et al. | 711/154 |

(Continued)

OTHER PUBLICATIONS

Sridhar, T., "A New Parallel Test Approach for Large Memories", Design & Test of Computers, IEEE (vol. 3, Issue: 4 ), pp. 15-22, Aug. 1986.

(Continued)

*Primary Examiner* — Cynthia Britt
(74) *Attorney, Agent, or Firm* — Edward J. Lenart; Katherine S. Brown; Kennedy Lenart Spraggins LLP

(57) ABSTRACT

In a method of memory testing in a data processing system, in response to receiving a request for a hardware memory test during boot process of the data processing system, a controller accesses a stored past memory test result. The past memory test result includes at least a first number of test loops used in a past memory test, an identification of a first test pattern, and an error that occurred in the past memory test. The controller adjusts a second number of test loops and a second test pattern to be used in the hardware memory test according to the past memory test result. The controller then performs the hardware memory test according to the adjusted second number of test loops and the second test pattern.

20 Claims, 3 Drawing Sheets

(56) References Cited

U.S. PATENT DOCUMENTS

| | | | |
|---|---|---|---|
| 2005/0188288 A1* | 8/2005 | Larson et al. | 714/718 |
| 2008/0184073 A1* | 7/2008 | Wang et al. | 714/36 |
| 2014/0095947 A1* | 4/2014 | Mozak et al. | 714/718 |
| 2014/0211580 A1* | 7/2014 | Ho et al. | 365/200 |

OTHER PUBLICATIONS

IBM, "Super-Fast Memory Test for the High Performance Computer", Technical Disclosure Bulletin, vol. 33 No. 10A (Mar. 1991), IP.com, No. IPCCOM000119855D, Apr. 2, 2005.

* cited by examiner

MEMORY TESTING IN A DATA PROCESSING SYSTEM

BACKGROUND

The present invention relates to memory testing in a data processing system.

Memory is an important component of computers, and its properties, such as compatibility, running speed, stability, and the like, play an important role in computer quality. As the demand of data processing capability continues to increase, memory has been playing an unprecedented role in computing industry. Memory subsystems with larger sizes and more advanced silicon technology lead to higher demand and heavier burden on memory testing.

On one hand, larger memory size results in broader test coverage. On the other hand, advancements in silicon fabrication process technology make memory devices more vulnerable to failure, which requires stricter memory testing, with more test loops and different test patterns, to ensure system reliability.

The effort required for memory testing is proportional to memory size and test loop count. The size of memory in computers is continuously increasing, and the same is true for test loop counts. Memory testing has become a major burden of system boot performance. From the perspective of accessibility and serviceability, system boot performance is critical for servers, in terms of availability and serviceability. Consequently, a tension exists in that memory subsystems need stricter and broader memory testing, but such memory testing can degrade server boot efficiency.

XEON® is a brand of processors available from Intel Corporation targeted to servers and advanced workstations. As with the Pentium® series, the Xeon brand has been maintained over several generations of processor architectures. Older models added the Xeon moniker to the end of their corresponding names in Pentium series (such as, Pentium II Xeon), but more recent models used the name Xeon on its own. Servers with Xeon processors generally support a very large amount of memory.

The memory controller of a server with a Xeon processor provides hardware-based memory testing. The basic input/output system (BIOS) can specify a test pattern, and the memory controller performs testing based on the pattern. If a test failure happens, it can be detected by the BIOS and can be reported to the memory controller to isolate the failed device. In order for more reliability and integrity, as the existing BIOS memory test solution, more memory test loops can be executed, with each loop using the same pattern. More test loop count means more reliability, but less system performance Currently, a common compromise for such BIOS memory testing is to perform one loop, or an arbitrary loop count, of hardware memory testing, with a random or arbitrary test pattern, as a balance between reliability and performance.

SUMMARY

An object of this invention is to provide a method and a system for memory testing in a data processing system, such as a server computer system having a Xeon-type processor.

According to one embodiment of the present invention, there is provided a method of memory testing, comprising: in response to receiving a request for a hardware memory test during boot process of the server, acquiring a stored past memory test result, wherein the past memory test result includes at least a number of test loops used in the memory test, a test pattern, and any error that occurred in the memory test; according to the acquired past memory test result, adjusting a number of test loops and a test pattern to be used in the hardware memory test; and performing the hardware memory test according to the adjusted number of test loops and the test pattern.

According to another embodiment of the present invention, there is provided a system for memory testing, comprising: a past memory test result acquisition unit, configured to, in response to receiving a request for a hardware memory test during boot process of the server, acquire a stored past memory test result, wherein a past memory test result includes at least a number of test loops used in the memory test, a test pattern and any error that occurred in the memory test; a hardware memory test adjustment unit configured to adjust a number of test loops and test pattern to be used in the hardware memory test according to the acquired past memory test result; and a hardware memory test execution unit configured to perform the hardware memory test according to the adjusted number of test loops and the test pattern to be used.

BRIEF DESCRIPTION OF THE SEVERAL VIEWS OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
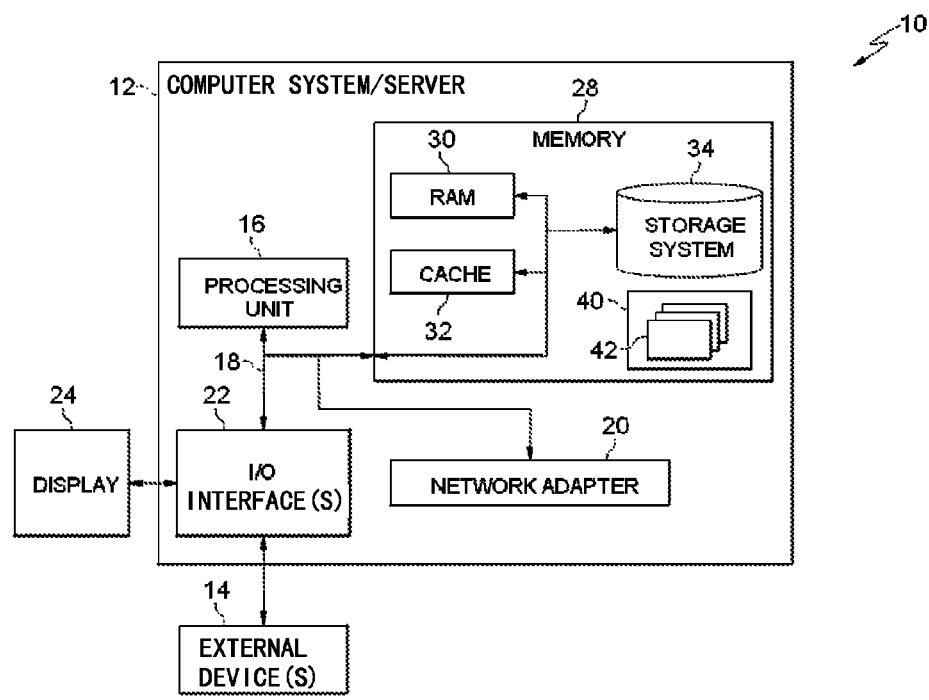
FIG. 1 shows an exemplary computer system/server which is applicable to implement the embodiments of the present invention.

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure and completely conveying the scope of the present disclosure to those skilled in the art.

As will be appreciated by one skilled in the art, aspects of the present invention may be embodied as a system, method or computer program product. Accordingly, aspects of the present invention may take the form of an entirely hardware embodiment, a software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the C programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, an exemplary computer system/server 12 which is applicable to implement the embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set of (at least one) program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
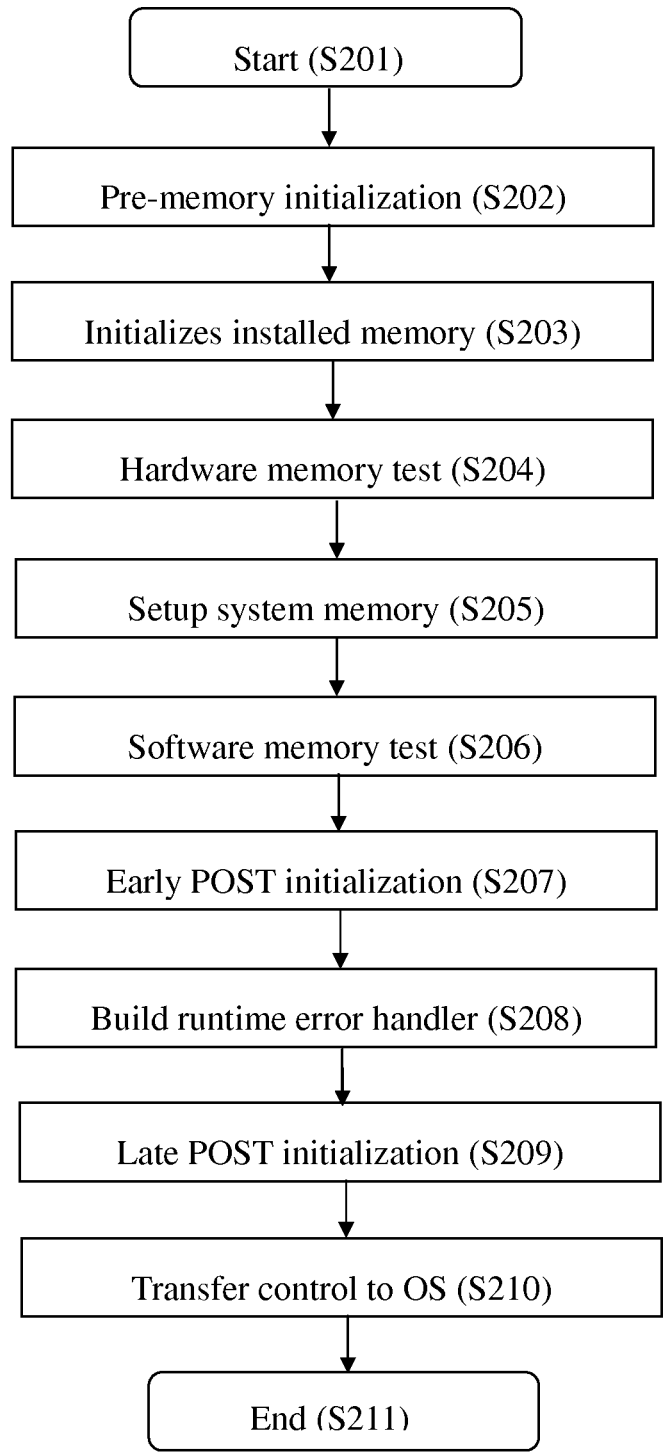
FIG. 2 schematically shows a flowchart of how BIOS initiates memory and loads an OS.

With reference now to FIG. 2, a flowchart of how BIOS initiates a memory and loads an OS is shown. At step S201, when the system is powered on, the BIOS starts a boot flow. At step S202, the BIOS performs pre-memory initialization. At that point, the primary initialization is transferred to the BIOS from the system without available system memory.

At step S203, after detecting system memory presence, size, speed, etc., the BIOS initializes all installed memory devices for system use, such that read/write operations can be performed on those memory devices. At step S204, the BIOS issues a "hardware memory test" command to the memory controller. The fundamental principle of hardware memory testing is to accomplish memory read/write and verification operations by the memory controller. During this step, the BIOS can specify a test pattern, and the memory controller performs write/read testing based on the pattern, once for a test loop. The existing memory hardware testing employs a fixed test pattern or a constant number of test patterns (e.g., 10). For a server system provided with 64 GB memory, a test loop takes 5-10 s for a test pattern, and 50-100 s for 10 test patterns. Obviously, hardware testing is very time consuming, which may greatly degrade boot efficiency of the server system. If test failure happens in this step, the failed device can be disabled and isolated immediately to prevent further access to the failed memory.

At step S205, after the hardware testing, system memory can be set up. All initialized memory devices that have passed the hardware memory test are mapped into a system memory map and can be accessed through memory addresses. At step S206, with this established system memory map, the BIOS performs a software memory test to complement the previous hardware test. The software test uses a sparse test coverage level to achieve much faster performance than the hardware test. That is, the existing software test only selects a memory area of about 1 GB to perform a read/write test. Similar to the hardware test, the existing software memory test also employs a fixed test pattern and one test loop.

At step S207, if the system has passed the hardware memory test and the software memory test, the process proceeds to a step "Early POST initialization". During this step, the BIOS initializes necessary system resources to prepare for the establishment of a runtime error handling mechanism. At step S208, a runtime error handling mechanism is built. The runtime error handling on a Xeon system is reported via SMI (System Management Interrupt) and IPMI (Intelligent Platform Management Interface). This step needs to setup SMM handler infrastructure and IPMI communication counterparts, so that memory testing is performed by the runtime error handling mechanism in subsequent steps. The SMM mode is a special operating mode of Intel X86 processors for handling system-level functions, such as power management, system hardware control, and special OEM-designed code. The SMM mode is designed merely for the use of system firmware, instead of application software and general system software. The primary benefit of SMM is to provide a separate and ready-to-use independent processor environment to facilitate the operations of OS and software applications. BIOS can register a SMM function for handling runtime errors, such as memory errors. In the case of recoverable memory errors, the SMM handling function directly returns after its handling and exits the SMM mode, so that the OS can continuously operate. In the case of fatal errors, the server system can be directly restarted.

At step S209, the process proceeds to "Late POST initialization" to prepare for OS startup. Then, at step S210, the OS boot loader is activated to fully take over control of the server system. The flow ends at step S211.

A test loop of the above hardware memory test with 10 constant test patterns will take a test time of 50-100 s, and even more test time is required in the case of multiple test loops. Actually, for a stable server system, it is reasonable to not perform the hardware test or to reduce the strictness of the hardware test. However, for an unstable memory system, a hardware test with one or constant test patterns is usually unable to fully detect all memory errors. Although a sparse software memory test is also unable to detect all memory errors, due to the high efficiency of the software memory test, more test loops can be executed with more test patterns, without loss in system boot efficiency. Therefore, in this invention historical results of memory tests are stored to determine whether the memory subsystem of a server is stable and to determine which level of memory testing that will be executed.

Figure 3:
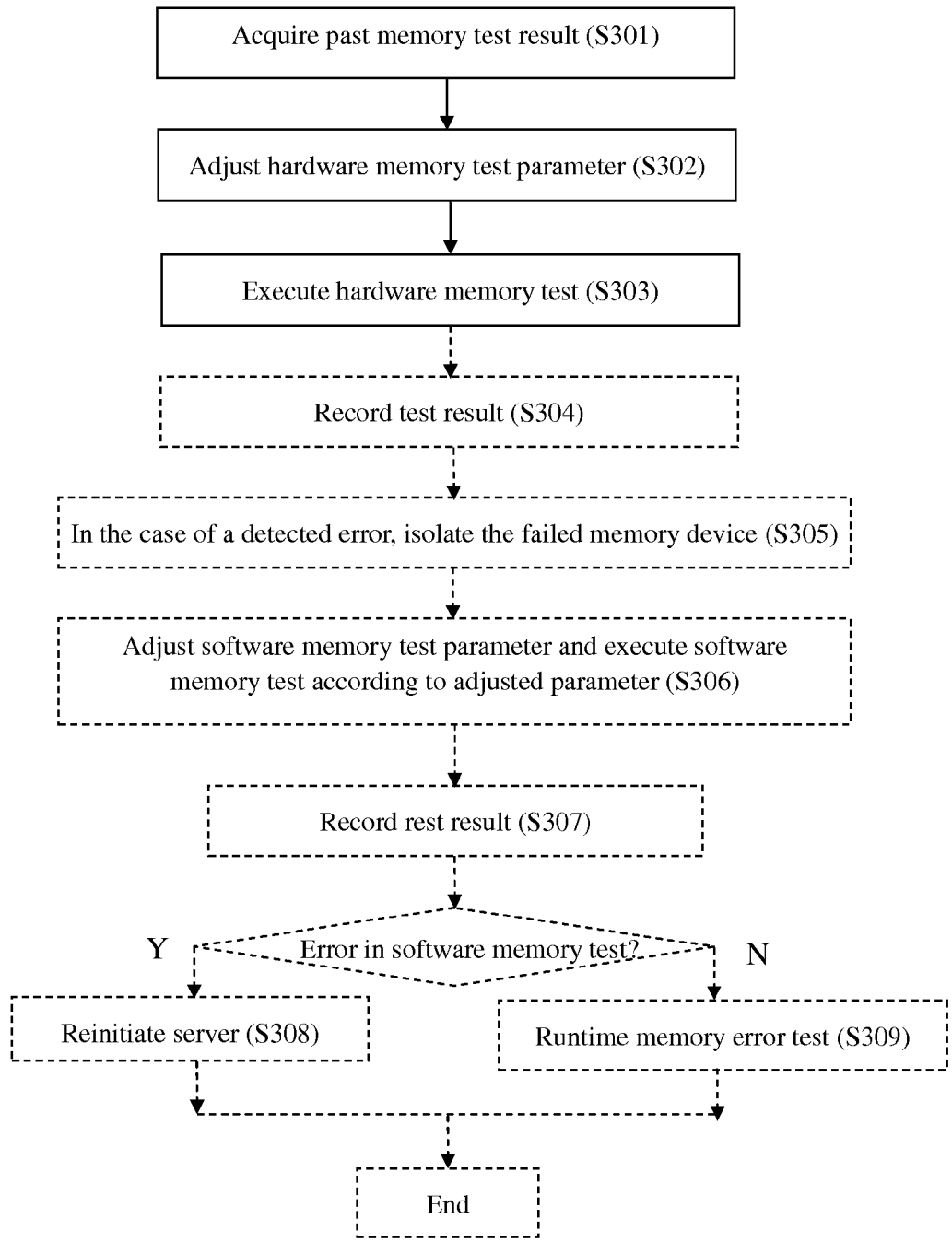
FIG. 3 shows a flowchart of a method of memory testing in a server with a Xeon-type processor according to an embodiment of this invention.

FIG. 3 shows a flowchart of a method of memory testing in a server with a Xeon-type processor according to an embodiment of this invention. According to FIG. 3, at step S301, in response to receiving a request for a hardware memory test during the boot process of the server, a stored past memory test result is obtained, wherein the past memory test result includes a number of test loops used in the memory test, a test pattern and any error occurred in the memory test. Herein, the past memory test results include at least one of: a past hardware memory test result, a past software memory test result, and a past runtime memory error. How to obtain these results will be described later. Past memory test results can be stored in flash memory, and there are no limits on their storage format.

At step S302, a number of test loops and test patterns used in the hardware memory test are adjusted according to the past memory test results obtained. The number of test loops and the test patterns used in this hardware test are adjusted according to the past memory test results obtained, with the following essential principle. As to the number of test loops, if the system is unstable and no error has been effectively detected in previous hardware memory tests, the number of test loops for the hardware memory test will be increased; if the system is stable, the hardware memory loop number can be decreased. As to test patterns, if the number of test patterns that have been stored is less than the number of test loops, preset or randomly selected patterns can be used as a complement.

The following situations can be considered.

(1) First boot: because there is not any past memory test result stored, specified memory test patterns and a determined number of test loops (e.g., 10) can be used for the hardware memory test.

(2) In response to normal stored past memory test result, that is, no memory test error has occurred, both the number of test loops and test patterns to be used in this hardware test will be set to zero, that is, this hardware memory test will be skipped. In other words, the number of test loops of the hardware memory test can be adjusted to zero in response to no error being present in the stored past memory test result. And then, in response to the number of test loops of this hardware memory test being set to zero, no hardware memory test will be executed. As such, for 64 GB memory, 50-100 s can be saved; or the number of test loops can be adjusted to a very small number (for example, 1), with a constant test pattern, so that time consumed in the hardware test can be reduced, and system boot efficiency can be improved.

(3) In response to some abnormal stored past memory test result and an abnormal previous software test result, for instance, if an error occurred in the previous software test with a test pattern (0X5A5AA5A5), only the pattern (0X5A5AA5A5) will be used for this hardware memory test; the number of test loops can be a constant number, such as 10, to detect memory errors.

Those skilled in the art may appreciate that the above adjustment is merely illustrative, and there are many ways of adjusting the hardware memory test, not merely limited to the above, that can be conceived by those skilled in the art. Any of these variations falls within the scope of this invention so long as the hardware memory test adjusts test patterns and the number of test loops for this hardware memory test according to past test results.

At step S303, the hardware memory test is performed according to the adjusted number of test loops and the test patterns. The situation of omitting the hardware memory test if both of the number of test loops and the test patterns are set to zero, i.e. skipping this hardware memory test, is included herein. This step can be performed by a hardware memory test logic provided by the memory controller of the server system with a Xeon-type processor. The hardware memory testing is initiated by BIOS, and executed by the memory controller.

In another embodiment, statistical analysis can be performed on the stored past memory test results. That is, the number of all memory errors that occurred in the stored past memory test results can be obtained. In response to the number of all memory errors that have occurred being larger than a predetermined threshold, the boot flow of the server can be terminated for hardware service, instead of further increasing the strength of memory testing (not shown in FIG. 3). Such an embodiment is useful for avoiding an endless loop situation, in which an error can be found in each software test, but no error can be found through hardware testing, leading to repeated memory testing of the system, which is an extreme case, however. Herein, the threshold can be set to 3 temporarily.

In another embodiment, at step S304, in response to the accomplishment of the hardware memory test, a hardware memory test result is recorded. This recorded result is accessed as a stored past memory test result in later memory tests. At step S305, in response to a memory error being detected in the hardware memory test, a failed memory device is temporarily disabled and isolated. At that point, the isolated memory device can not be accessed later, and no software test will be executed thereon. The testing method cannot be reinitiated unless the failed memory device is replaced when system rebooting. The BIOS module can use the memory controller to isolate failed memory devices in the Memory Initiation module. It is also possible in another embodiment to check whether there are sufficient system memory devices remaining after isolating the failed memory device. In response to determining that insufficient system memory devices remain, the boot process of the server is terminated, and a user is notified to replace the failed memory device (not shown in FIG. 3).

At step S306, a number of test loops and test patterns to be used in a software memory test are adjusted according to the past memory test results obtained, and the software memory test is performed according to the adjusted number of test loops and the test patterns to be used. The software memory test uses a sparse test coverage level, that is, at a read/write interval of 1M bytes (wherein, 1M=1,000,000). Thereby, the time of software memory testing is much less than the time of hardware memory testing. If an error occurs in the memory test, the probability of detecting it with sparse software test is high. Software memory testing is faster than hardware memory testing, so that more test patterns can be tested, without obvious degradation in server boot performance due to the use of more test patterns. However, software testing can only detect failed memory addresses and can not identify and isolate failed memory devices. Assuming there are 10 test patterns 0xAAAAAAAA, 0x55555555, 0x5A5A5A5A, 0xA5A5A5A5, 0xFFFFFFFF, 0x00000000, 0xF0F0F0F0, 0x0F0F0F0F, 0x12345678, 0x87654321 predetermined in the BIOS respectively, the following situations are possible.

(1) If no error occurs in this hardware memory test or the hardware memory test is skipped, then all test patterns have to be used in this software test, with each test loop using a different test pattern.

(2) In response to an error being detected in this hardware memory test, for example, when using the test pattern 0xAAAAAAAA, the test pattern 0xAAAAAAAA will be omitted in this software test, and the other 9 remaining test patterns will be used, one test pattern for each test loop. Because all memory devices are involved in the hardware memory test, if there is a test pattern in which an error occurs, the failed device will be isolated, and it is not necessary to perform a software memory test on the failed device, thereby achieving a balance between memory system reliability and server boot efficiency.

Those skilled in the art may appreciate that the above adjustment is merely illustrative, and there are many ways of adjusting software memory testing, not merely limited to the above, that can be conceived by those skilled in the art. Any of such adjustments falls within the scope of this invention so long as the software memory test adjusts test patterns and the number of test loops for this memory test according to past test results.

Herein, software memory testing differs from hardware memory testing in that software memory testing only performs a read/write test on the last 1 MB bytes of each memory, with the advantage of covering not only all test patterns, but also each memory module. For a system provided with 16 memory modules of 4G bytes (wherein, 1G=1,000,000,000) (64G bytes in total), at most 16*1M*10=160M bytes need to be tested. For a current system with memory bandwidth up to GB/s, performing a read/write test on 160 MB only requires no more than 1 s.

In an embodiment, at step S307, in response to the accomplishment of the software memory test, a software memory test result is recorded, which is accessed as a stored past memory test result in later memory tests. At step S308, in response to an error occurring in the software memory test, the server boot flow is reinitiated. There are two possible reasons for a failed software memory test. First, the hardware memory test was skipped. Therefore, the server system has to be rebooted after the failed software test, and a hardware memory test will be performed again with the failed pattern. The other case is that the hardware memory test was performed, but it failed to capture the error, possibly due to insufficient test loops and ineffective test patterns. After the software test fails, the system is reset, and the hardware test increases the number of test loops and uses the failing pattern in which the error was found in the software memory test.

In another embodiment, the method further includes a step S309, in which in response to no error being detected in the software memory test and a runtime memory error being detected, the runtime memory error is recorded. It is determined whether the memory error is fatal to the operation of the server. In response to a fatal memory error to the operation of the server, the server boot flow is reinitiated. Thereby, new hardware and software memory tests can be adjusted based on error status. For a server with a Xeon-type processor, if the hardware and software memory tests have been passed, the system boots to late power-on self-test (POST) or operating system (OS). If a memory error then occurs, the BIOS or Baseboard Management Controller (BMC) can be notified to handle it. Similar to software memory testing, if an error is detected by the runtime error handler, it records error information, so that during the next power cycle, the hardware memory test can increase test strictness accordingly.

If the server passes the hardware memory test, the software memory test, and the runtime memory test, the test flow ends. In this invention, for server systems without memory errors, the time of the hardware memory test can be saved. Because this is true in most cases, system boot efficiency can be greatly improved. For systems with memory errors, the time required for memory testing is as the same as that of the existing memory test design, resulting in no degradation in system boot efficiency.

Figure 4:
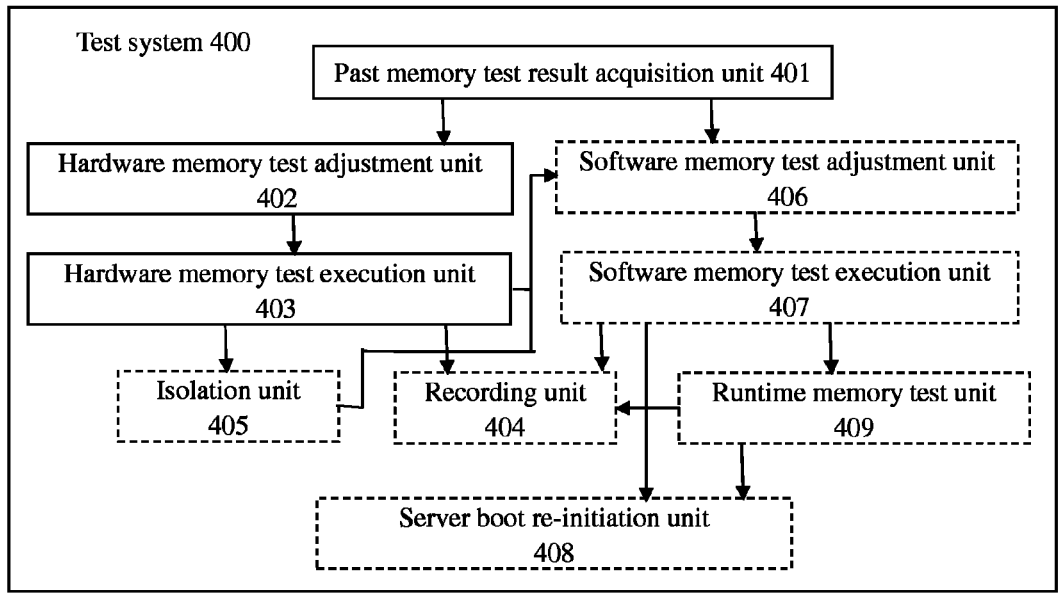
FIG. 4 shows a structure diagram of a system for memory testing in a server with a Xeon-type processor according to an embodiment of this invention.

Under the same inventive concept, a system for memory testing in a server with a Xeon-type processor is further provided in this invention. FIG. 4 is a diagram of a system 400 for memory testing in a server with a Xeon-type processor according to an embodiment of this invention. According to FIG. 4, the system includes: a past memory test result acquisition unit 401 configured to, in response to receiving a request for hardware memory testing during boot process of the server, access a stored past memory test result, wherein the past memory test result includes at least a number of test loops used in the test, test patterns, and any errors that occurred in the test; a hardware memory test adjustment unit 402 configured to adjust the number of test loops and test patterns used in the hardware memory test according to the accessed past memory test result; and a hardware memory test execution unit 403 configured to perform the hardware memory test according to the adjusted number of test loops and the test patterns to be used.

In an embodiment, the past memory test result includes at least one of: a past hardware memory test result, a past software memory test result, and a past runtime memory error.

In an embodiment, the hardware memory test adjustment unit is further configured to, in response to no error being present in the stored past memory test result, set the number of test loops to zero for the hardware memory test, wherein in response to the number of test loops of the hardware memory test being set to zero, the hardware memory test adjustment unit is configured to not execute the hardware memory test.

In an embodiment, the system further includes a statistics unit, configured to obtain a number of occurrences of all memory errors in the stored past memory test result; and a server boot termination unit, configured to, in response to the number of occurrences of all memory errors being larger than a predetermined threshold, terminate the boot flow of the server (not shown in FIG. 4).

In an embodiment, the system further includes a recording unit 404 configured to, in response to completion of the hardware memory test, record a hardware memory test result.

In an embodiment, the system further includes an isolation unit 405 configured to, in response to a memory error being detected by the hardware memory test execution unit, disable and isolate a failed memory device.

In an embodiment, the system further includes a determination unit configured to determine whether there are sufficient active memory devices remaining after a failed memory device has been isolated; and a server boot termination unit configured to, in response to determining that there are not sufficient active memory devices remaining, terminate the boot flow of the server and notify a user to replace the failed memory device (not shown in FIG. 4).

In an embodiment, the system further includes a software memory test unit 406 configured to adjust a number of test loops and test patterns used in a software memory test according to the past memory test results acquired; and a software memory test execution unit 407 configured to execute the software memory test according to the adjusted number of test loops and the test patterns to be used.

In an embodiment, the recording unit of the system is further configured to, in response to completion of the software memory test, record a software memory test result.

In an embodiment, the system further includes a server boot re-initiation unit 408 configured to, in response to detection of an error by the software memory test execution unit, reinitiate the boot flow of the server.

In an embodiment, the system further includes a runtime memory test unit 409 configured to, in response to detecting a runtime memory error, instruct the recording unit to record the runtime memory error; and a server boot re-initiation unit 408 configured to, in response to detecting a runtime memory error, determine whether the runtime memory error is fatal to the operation of the server, and in response to a determination that the runtime memory error is fatal to the operation of the server, reinitiate the boot flow of the server.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of memory testing in a data processing system, the method comprising:
   in response to receiving a request for a hardware memory test during boot process of the data processing system, a controller accessing a stored past memory test result, wherein the past memory test result includes at least a first number of test loops used in a past memory test, an identification of a first test pattern, and any error that occurred in the past memory test;
   the controller adjusting a second number of test loops and a second test pattern to be used in the hardware memory test according to the past memory test result; and
   the controller performing the hardware memory test according to the adjusted second number of test loops and the second test pattern.

2. The method according to claim 1, wherein the past memory test result comprises at least one of a past hardware memory test result, a past software memory test result, and a past runtime memory error.

3. The method according to claim 1, wherein:
   the adjusting includes in response to no error being present in the stored past memory test result, setting the second number of test loops for the hardware memory test to zero; and
   the performing includes in response to the second number of test loops for the hardware memory test being zero, skipping the hardware memory test.

4. The method according to claim 1, further comprising:
   obtaining a number of occurrences of all memory errors in the stored past memory test result;
   in response to the number of occurrences of all memory errors satisfying a predetermined threshold, terminating the boot flow of the data processing system.

5. The method according to claim 1, further comprising:
   in response to completion of the hardware memory test, recording a hardware memory test result.

6. The method according to claim 5, further comprising:
   in response to detecting a memory error in the hardware memory test, disabling and isolating a failed memory device.

7. The method according to claim 6, further comprising:
   determining whether the data processing system has sufficient remaining active memory devices after isolation of the failed memory device;
   in response to determining that the data processing system does not have sufficient active memory devices, terminating the boot flow and issuing a notification to replace the failed memory device.

8. The method according to claim 5, further comprising:
   adjusting a third number of test loops and a third test pattern used in a software memory test according to the past memory test result; and
   executing the software memory test according to the adjusted third number of test loops and the third test pattern.

9. The method according to claim 8, further comprising:
   in response to completion of the software memory test, recording a software memory test result.

10. The method according to claim 9, further comprising:
    in response to detecting an error in the software memory test, reinitiating the boot flow of the data processing system.

11. The method according to claim 9, further comprising:
    in response to no error being detected in the software memory test and a runtime memory error being detected, recording the runtime memory error;
    determining whether the runtime memory error is fatal to operation of the data processing system; and
    in response to determining the runtime memory error is fatal to operation of the data processing system, reinitiating the boot flow of the data processing system.

12. A system for memory testing in a data processing system, the system comprising:
    a past memory test result acquisition unit configured to, in response to receiving a request for a hardware memory test during a boot process of the data processing system, access a stored past memory test result, wherein the past memory test result includes at least a first number of test loops used in the memory test, a first test pattern, and any error that occurred in the past memory test;
    a hardware memory test adjustment unit configured to adjust a second number of test loops and a second test pattern to be used in the hardware memory test according to the past memory test result; and
    a hardware memory test execution unit configured to perform the hardware memory test according to the adjusted second number of test loops and the second test pattern.

13. The system according to claim 12, wherein the past memory test result comprises at least one of a past hardware memory test result, a past software memory test result, and a past runtime memory error.

14. The system according to claim 12, wherein:
    the hardware memory test adjustment unit is further configured to, in response to no error being present in the stored past memory test result, set the second number of test loops for the hardware memory test to zero; and
    the hardware memory test execution unit is configured, in response to the second number of test loops for the hardware memory test being zero, to skip the hardware memory test.

15. The system according to claim 12, further comprises:
    a statistics unit configured to obtain a number of occurrences of all memory errors in the stored past memory test result; and
    a data processing system boot termination unit configured to, in response to the number of occurrences of all memory errors satisfying a predetermined threshold, terminate the boot flow of the data processing system.

16. The system according to claim 12, further comprising:
    a recording unit configured to, in response to completion of the hardware memory test, record a hardware memory test result.

17. The system according to claim 16, further comprises an isolation unit configured to, in response to detection of a memory error by the hardware memory test execution unit, disable and isolate the failed memory device.

18. The system according to claim 17, further comprises:
    a determination unit configured to determine whether sufficient active memory devices remain after the failed memory device has been isolated; and a data processing system boot termination unit configured to, in response to determining that sufficient memory devices do not remain active, terminate the boot flow of the data processing system and issue a notification to replace the failed memory device.

19. A program product, comprising:

a computer readable storage medium, wherein the computer readable storage medium is not a signal; and program code stored within the computer readable storage medium, wherein the program code, when executed, causes a data processing system to perform:

in response to receiving a request for a hardware memory test during boot process of the data processing system, accessing a stored past memory test result, wherein the past memory test result includes at least a first number of test loops used in a past memory test, an identification of a first test pattern, and any error that occurred in the past memory test;

adjusting a second number of test loops and a second test pattern to be used in the hardware memory test according to the past memory test result; and performing the hardware memory test according to the adjusted second number of test loops and the second test pattern.

20. The program product according to claim 19, wherein the past memory test result comprises at least one of a past hardware memory test result, a past software memory test result, and a past runtime memory error.

\* \* \* \* \*